(12) United States Patent
Haycock

(10) Patent No.: US 7,006,580 B2
(45) Date of Patent: Feb. 28, 2006

(54) METHOD FOR CONTROLLING A DATA TRANSMISSION PRE-EMPHASIS UNIT AND A DATA TRANSMISSION SYSTEM EMPLOYING THE METHOD

(75) Inventor: Robert John Haycock, Stockport (GB)

(73) Assignee: Xyratex Technology Limited, Hampshire (GB)

( * ) Notice: Subject to any disclaimer, the term of this patent is extended or adjusted under 35 U.S.C. 154(b) by 1023 days.

(21) Appl. No.: 09/808,613

(22) Filed: Mar. 14, 2001

(65) Prior Publication Data

US 2001/0024477 A1   Sep. 27, 2001

(30) Foreign Application Priority Data

Mar. 14, 2000   (GB)   .................................... 0005976

(51) Int. Cl.
*H04L 25/03*   (2006.01)
(52) U.S. Cl. .................................... 375/296
(58) Field of Classification Search ................ 342/118, 342/127; 600/445; 375/224, 259, 295, 297, 375/318, 355, 358, 296, 213, 214
See application file for complete search history.

(56) References Cited

U.S. PATENT DOCUMENTS

| | | | |
|---|---|---|---|
| 4,027,259 A | | 5/1977 | Zellmer |
| 4,607,231 A | | 8/1986 | Nakayama |
| 4,739,268 A | * | 4/1988 | Fox .............................. 324/314 |
| 4,743,910 A | * | 5/1988 | Hill et al. .................... 342/159 |
| 5,018,528 A | * | 5/1991 | Morita et al. ............... 600/445 |
| 5,103,728 A | * | 4/1992 | Barney ....................... 101/364 |
| 5,287,386 A | | 2/1994 | Wade et al. ................... 375/36 |
| 5,319,972 A | * | 6/1994 | Oblak et al. ............... 73/290 R |
| 5,323,423 A | | 6/1994 | Townsend et al. |
| 5,471,170 A | | 11/1995 | Genest ........................ 330/151 |
| 5,486,777 A | | 1/1996 | Nguyen |
| 5,533,054 A | | 7/1996 | DeAndrea et al. |
| 5,901,818 A | * | 5/1999 | Martino ................ 188/218 XL |
| 5,966,032 A | | 10/1999 | Elrabaa et al. ................ 326/84 |

(Continued)

FOREIGN PATENT DOCUMENTS

DE   3234737   3/1984

(Continued)

*Primary Examiner*—Emmanuel Bayard
(74) *Attorney, Agent, or Firm*—Pillsbury Winthrop Shaw Pittman LLP

(57) ABSTRACT

In a pre-emphasis unit device which transmits signals along a transmission line with a frequency-dependent pre-emphasis, the frequency response of the pre-emphasis unit is varied to match characteristics of the transmission line. Initially the pre-emphasis unit is set to transmit pulses of known length along a transmission line with the pre-emphasis of the high frequency portions of the signal being relatively low. The duration of the received pulse is measured. Gradually the pre-emphasis unit is modified to increase the high-pass filtered signals until the measured duration of the pulse is as great as the transmitted duration, to within a certain tolerance.

8 Claims, 7 Drawing Sheets

U.S. PATENT DOCUMENTS

| | | | | |
|---|---|---|---|---|
| 5,986,602 A | * | 11/1999 | Frink | 342/126 |
| 6,062,070 A | * | 5/2000 | Maltby et al. | 73/61.49 |
| 6,097,329 A | * | 8/2000 | Wakayama | 342/26 R |
| 6,115,112 A | * | 9/2000 | Hertzman et al. | 356/5.01 |
| 6,122,602 A | * | 9/2000 | Michalski et al. | 702/159 |
| 6,142,942 A | * | 11/2000 | Clark | 600/443 |
| 6,193,661 B1 | * | 2/2001 | Clark et al. | 600/443 |
| 6,212,943 B1 | * | 4/2001 | Maltby et al. | 73/61.49 |
| 6,218,982 B1 | * | 4/2001 | Shirai et al. | 342/118 |
| 6,263,094 B1 | * | 7/2001 | Rosich et al. | 382/128 |
| 6,295,874 B1 | * | 10/2001 | Strutt et al. | 73/597 |
| 6,393,377 B1 | * | 5/2002 | Shirai et al. | 702/159 |
| 6,404,338 B1 | * | 6/2002 | Koslar | 340/571 |
| 6,517,240 B1 | * | 2/2003 | Herb et al. | 374/117 |

FOREIGN PATENT DOCUMENTS

| | | |
|---|---|---|
| EP | 0858195 | 8/1998 |
| GB | 2094592 | 9/1982 |

* cited by examiner

METHOD FOR CONTROLLING A DATA TRANSMISSION PRE-EMPHASIS UNIT AND A DATA TRANSMISSION SYSTEM EMPLOYING THE METHOD

FIELD OF THE INVENTION

The present invention relates to a pre-emphasis unit which provides frequency dependent pre-emphasis to data before transmitting it, and in particular to a method for calibrating the pre-emphasis unit, and a data transmission system employing the method.

BACKGROUND OF THE INVENTION

The frequency response of a interconnect (e.g. a PCB/cable) used for data transmission attenuates the high frequency components of a data stream. The level of this attenuation is illustrated schematically in FIG. 1, showing that it arises at above a frequency labelled $\omega_2$. When the attenuation starts below the maximum frequency of the data stream, this leads to a phenomenon known as inter-symbol interference (ISI), in which certain data patterns cause thinning of the data pulse widths, and hence there is data dependant jitter. A worst case example of this is for a data pattern in which the transmitted data has a single data high amongst data lows, as shown in FIG. 2(a). The attenuation of the high frequency components of the single data high results in a pulse which has reduced amplitude and long rise/fall times. Consequently pulse widths are reduced as shown in FIG. 2(b).

The CML type driver, illustrated in FIG. 3, includes a differential pair at the transmitter and loads at the receiver. The two inputs (which are equal and opposite voltage signals) are amplified by an amplifier 1, and then fed as equal and opposite signals txn and txp to respective transistors 3,5. The transmission lines 7, 9 have an impedance $Z_0$. The loads R are at the termination for the transmission lines. An rx amp 10 is provided at the output. The gain of the driver is proportional to the width of the transistors 3,5 in the differential pair. Wider transistors provide more gain, A CML-type driver illustrated in FIG. 3 provides equal gain at all frequencies.

However, drivers are known which provide a pre-emphasis which flattens the frequency response of the interconnect at higher frequencies, preferably up to and beyond the data signal frequency. This is illustrated in FIG. 4, in which FIG. 4(a) is the frequency response of the interconnect, FIG. 4(b) is the frequency response of the pre-emphasis filter which has a pole at $\omega 2$. and FIG. 4(c) is the frequency response of the combination of the two, which is flat up to frequency $\omega_1$. The pre-emphasis filter has a zero at $\omega_2$ to cancel the attenuation of the interconnect. The pre-emphasis filter also has a pole at $\omega_1$ but this is higher than the maximum data frequency. Such known drivers employ passive components to achieve the frequency response shown in FIG. 4(b). This means that, taking the pre-emphasis and data transmission period as a whole, low and high frequency components are both attenuated by the same amount, and little or no thinning of the pulse widths occurs.

SUMMARY OF THE INVENTION

The transmission characteristics of a given transmission line are usually unknown. The present invention seeks to provide a new and useful method for calibrating a frequency-dependent data transmission driver, so that the characteristics of the pre-emphasis are matched to the transmission characteristics, The present invention further seeks to provide a data transmission system employing the method.

In general terms, the present invention proposes: initially setting a driver (pre-emphasis unit) arranged to transmit data along a transmission line so that the pre-emphasis of the high frequency portions of the signal is low; transmitting pulses of known length (e.g. worst case—that is narrowest—pulses), measuring the duration of the received pulse; and gradually (e.g. incrementally) modifying the driver to increase the influence of high-pass filtered signals until the measured duration of the pulse is as great as the transmitted duration (to within a certain tolerance).

Specifically, a first expression of the present invention is a method for use in a system which includes a device for differentially amplifying low frequency components and high frequency components in a received signal, and in which the amplified signal is transmitted from a first end of a transmission line to a second end of the transmission line, the method being for setting the differential amplification of the low frequency and high frequency components, the method including:

repeatedly generating pulses of known duration;

amplifying low frequency components and high frequency components in the generated pulses to different degrees to form a modified pulse;

transmitting the modified pulses along the line from the first end;

measuring the duration of the received pulses received at the second end; and increasing the degree to which high frequency components are amplified relative to low frequency components until the measured duration of the received pulses is equal to the known duration of the generated pulses to within a predetermined tolerance.

Alternatively, the invention may be expressed as a data transmission system which includes:

a pre-emphasis unit for receiving a signal, differentially amplifying low frequency components and high frequency components in the received signal and transmitting the amplified signal into a first end of a transmission line, a pulse generator for repeatedly generating pulses of known duration and supplying them to the pre-emphasis unit, a receiver located at a second end of the transmission line for receiving the pulses and measuring the duration of the received pulses received; and a controller for controlling the pre-emphasis unit to increase the degree to which high frequency components are amplified relative to low frequency components until the measured duration of the received pulses is equal to the known duration of the generated pulses to within a predetermined tolerance.

Preferably, there are two transmission lines, as in the known data transmission systems described above, the pre-emphasis unit transmitting equal and opposite signals along them, and the receiver measuring the duration of the received pulses using the signals received along both of the transmission lines.

BRIEF DESCRIPTION OF THE DRAWINGS

Non-limiting embodiments of the invention will now be described for the sake of example only with reference to the accompanying drawings in which.

DETAILED DESCRIPTION OF EMBODIMENTS

Figure 3:
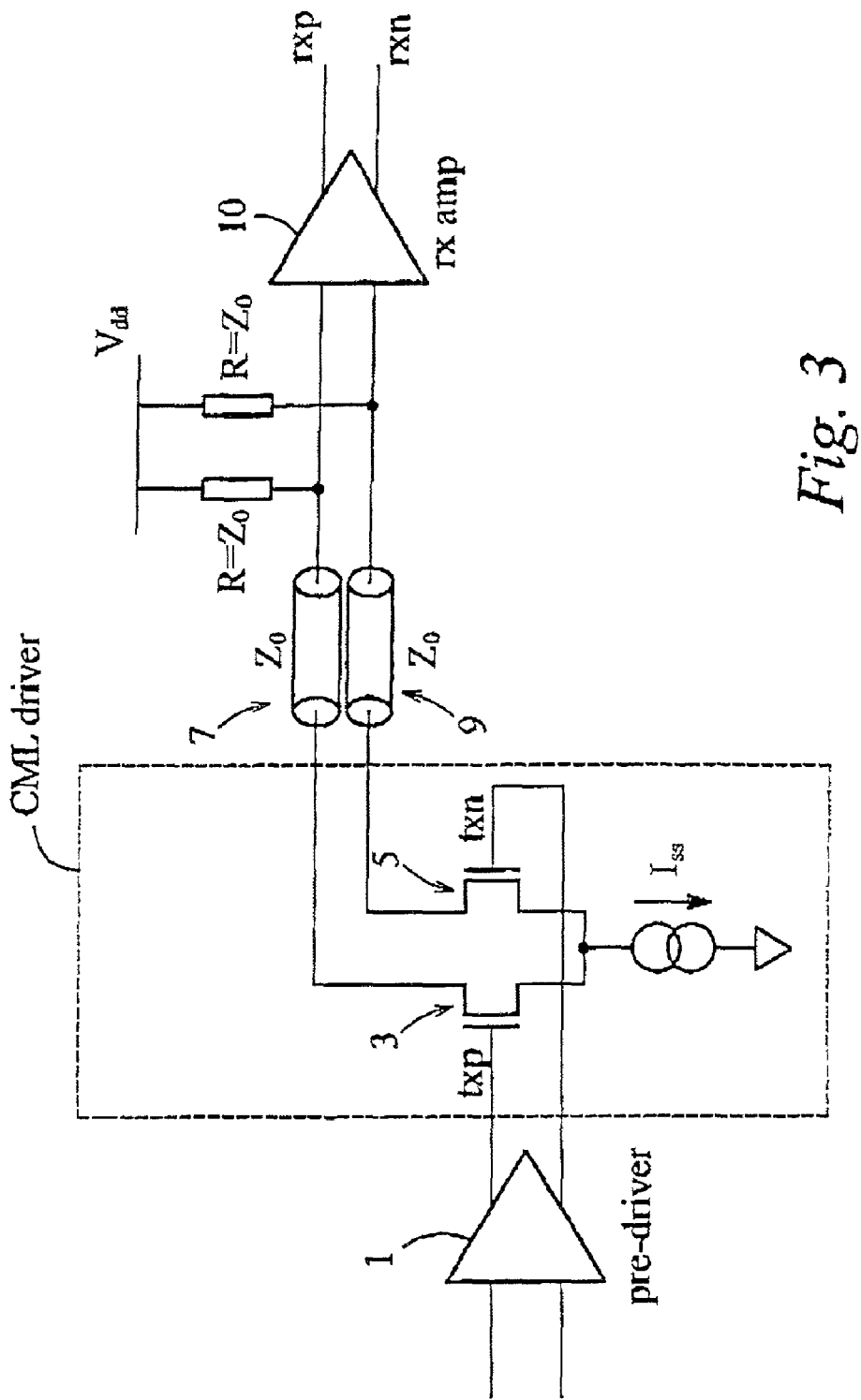
FIG. 3 shows a known CDL driver.
Figure 5:
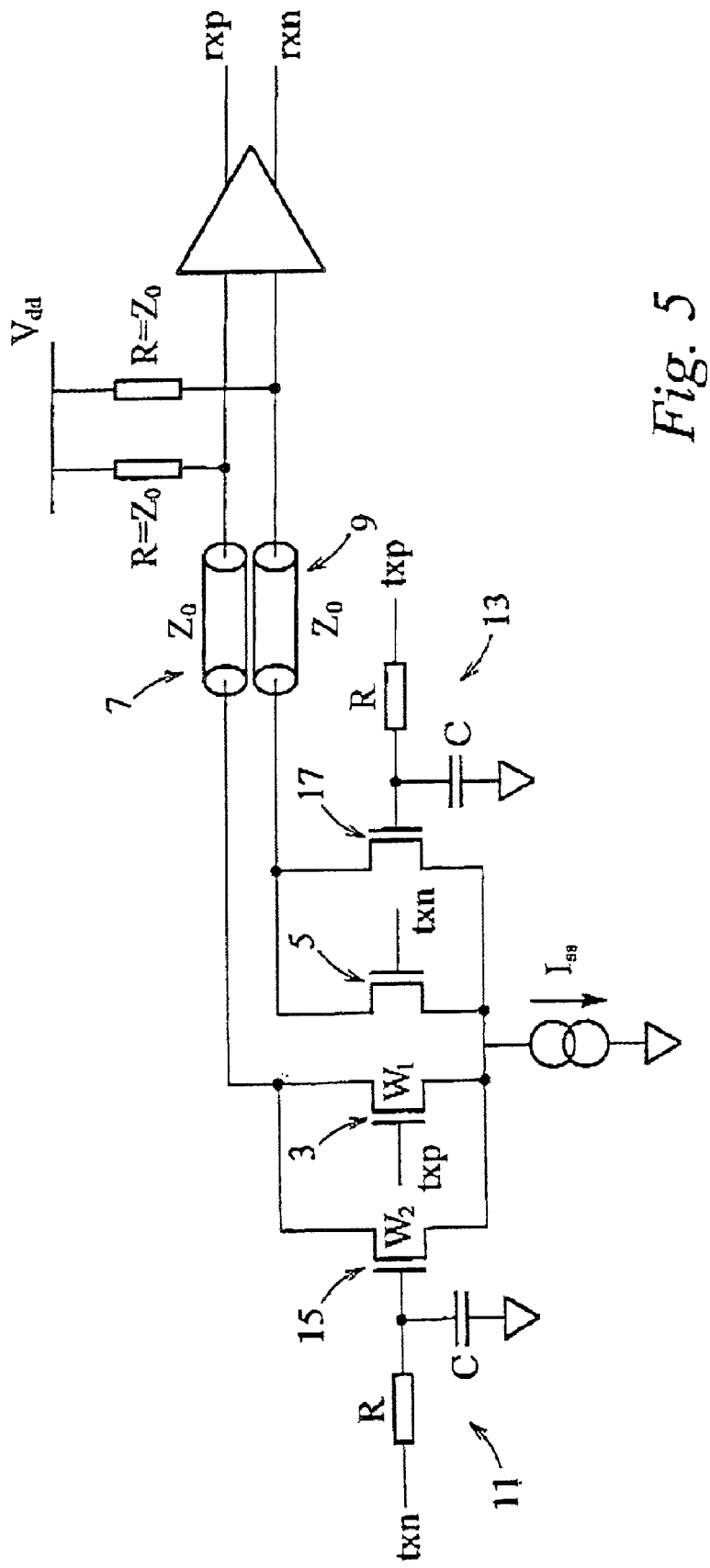
FIG. 5 shows a first driver which can be calibrated using a method according to an embodiment of the present invention.

FIG. 5 shows a data transmission system which is disclosed in our UK patent application 0005976.6. In the differential pair for the CML driver (pre-emphasis unit), there are, in comparison with the driver of FIG. 3, two low pass filters 11,13, which each consist of a a resistor R and capacitor C, and additional transistors 15,17. The transistors 15, 17 each have a width (which is proportional to gain) $W_2$. Each of the two complementary (equal and opposite) input signals are amplified to form equal and opposite signals txp and txn, are these are divided into two signal paths (by components which are not shown). Note that the amplification may alternatively be performed after the signals txp are divided. For each signal, a first signal path leads to a respective transistor 3,5 of width $W_1$ and controls a current through the transistor which is directed into a respective transmission line 7,9 in the manner described above in relation to FIG. 3; a second signal path passes through one of the low pass filters 11,13 to a respective one of the transistors 15, 17 of width $W_2$, which controls another current, which is directed to the respective other one of the transmission lines. In other words, each transmission line carries a current which is the sum of a current passing through a transistor of width $W_1$ and a current passing through a transistor of width $W_2$ which is controlled by a low-pass filtered version of the opposite input signal.

Therefore, for a low frequency signal, the gain of the driver (e.g. the signal which is passed to the first transmission line 9 compared to signal txp) is proportional to $W_1-W_2$ (i.e. width1–width2). At high frequencies, the low pass filters 11,13 mean that no signal is applied to the transistors 15,17, so that the gain of the driver is proportional to $W_1$. The width $W_1$ should be bigger than $W_2$, otherwise the correct frequency response will not be achieved, and as $W_2$ approaches $W_1$ the maximum difference in the two gains is achieved.

Figure 6:
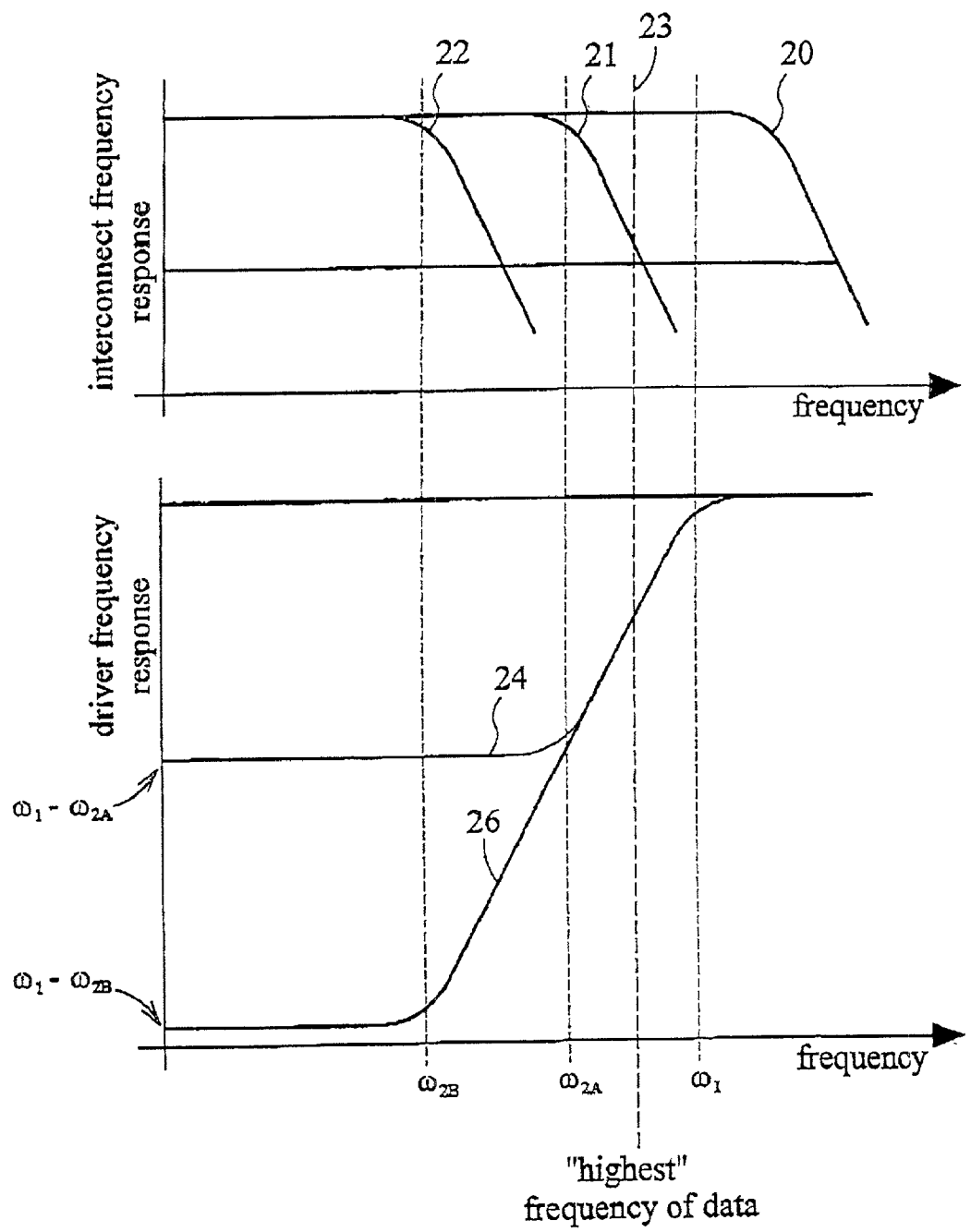
FIG. 6 illustrates the effect of modifying the driver shown in FIG. 5.

We will now analyse in more detail, and in relation to FIG. 6, the operation of the driver of FIG. 5.

Figure 1:
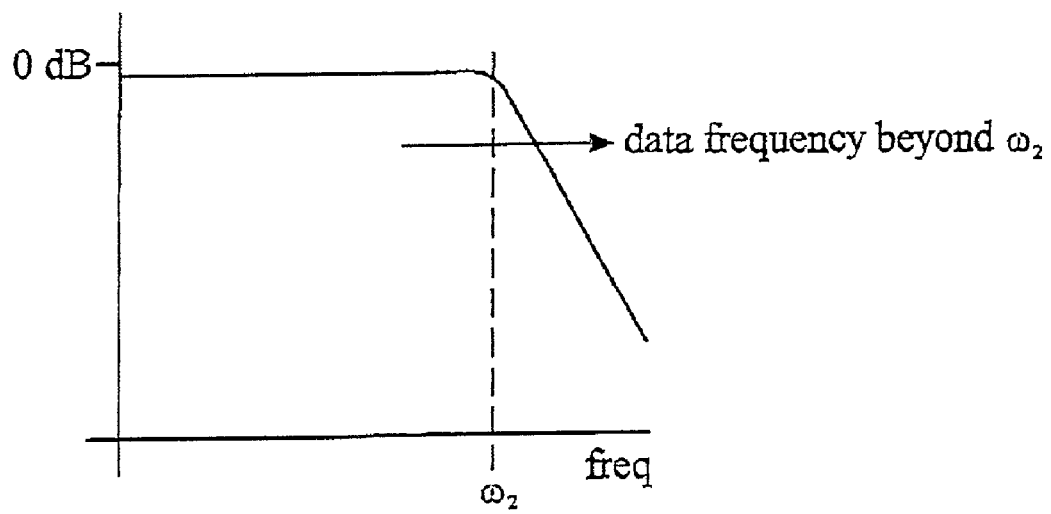
FIG. 1 shows a typical frequency response of a transmission line.
Figure 2:
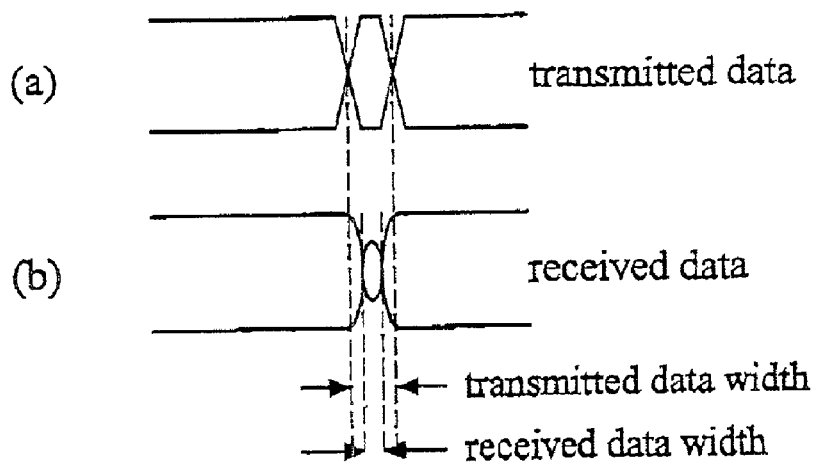
FIG. 2 shows the modification in transmitted data caused by transmission along the transmission line of FIG. 1.

The upper portion of FIG. 6 shows the frequency response of three transmission lines 20, 21, 22. A relatively short interconnect (e.g. with a length of a few cm) has a frequency response shown as 20, which is a plateau up to a relatively high frequency, but above this frequency gradually decreases ("rolls off"). This "roll-off" frequency is above the highest frequency present in the data marked by the dashed line 23, and so causes no problem. Typically, the frequency 23 is at least 200 MHz or at least 500 MHz, typically more than 1 GHz for $10^{11}$ of FR4 PCB. Progressively longer transmission lines have frequency responses 21, 22 with progressively lower roll-off frequencies $\omega_{2A}$, $\omega_{2B}$. Frequently, the roll-off frequency of a given transmission line is not known in advance, For a transmission line with a roll off frequency below the highest data frequency (which in typical high speed modem applications may happen when the transmission line is as short as only a few tens of centimeters), the problems illustrated in FIG. 2 will occur.

Turning to the lower portion of FIG. 6, lines 24,26 show the frequency response for two drivers according to FIG. 5 having the same value of $W_1$ but different respective values of $W_2$, namely $W_{2A}$ and $W_{2B}$ where $W_{2B}$ is closer to $W_1$ than $W_{2A}$. At high frequency, the maximum gain for each is $W_1$, but the gain of each line 24,26 decreases for frequencies below $\omega_1=1/(2\pi RC)$ and reaches its lowest value, determined by $W_1$ and $W_2$ at a lower frequency, Specifically, the gain of each driver decreases from $\omega_1$ by 20 dB/decade as a result of the filters, until it intercepts the minimum gain $(W_1-W_2)$ of the drive. This minimum gain is thus achieved at a frequency (respectively $\omega_{2A}$ and $\omega_{2B}$) which depends upon the respective values $W_{2A}$ and $W_{2B}$.

Figure 4:
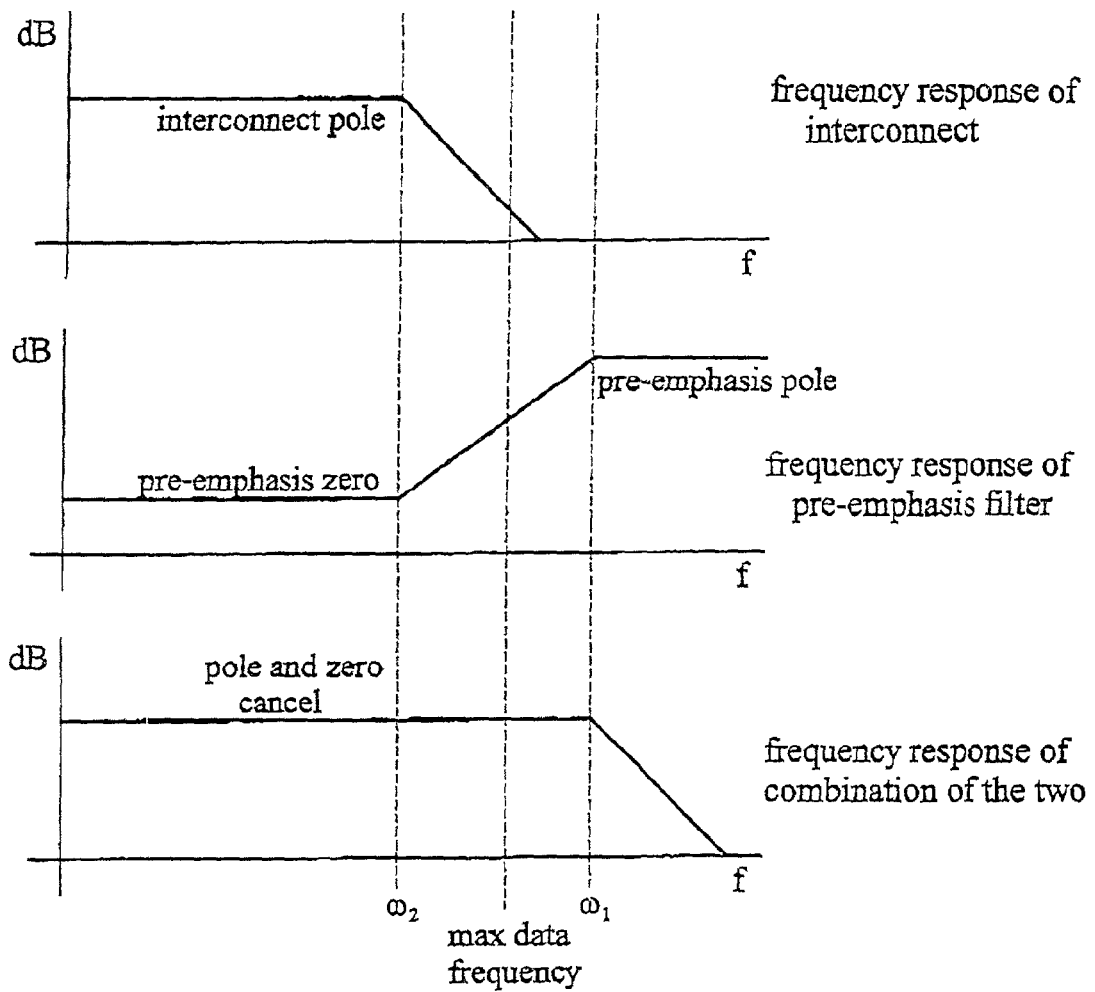
FIG. 4 shows a known pre-emphasis technique.

The gain profile 24 is complementary to the frequency response 21, so that it is suitable for providing pre-emphasis in the manner shown in FIG. 4 for the "long" transmission line. Similarly, the gain profile 26 is complementary to the frequency response 22, so that is particularly suitable for providing pre-emphasis for the "very long" transmission line.

The above discussion demonstrates that the frequency response of a driver according to FIG. 5 can be adjusted (tuned) by altering the width $W_2$, for example by replacing the transistors.

Figure 7:
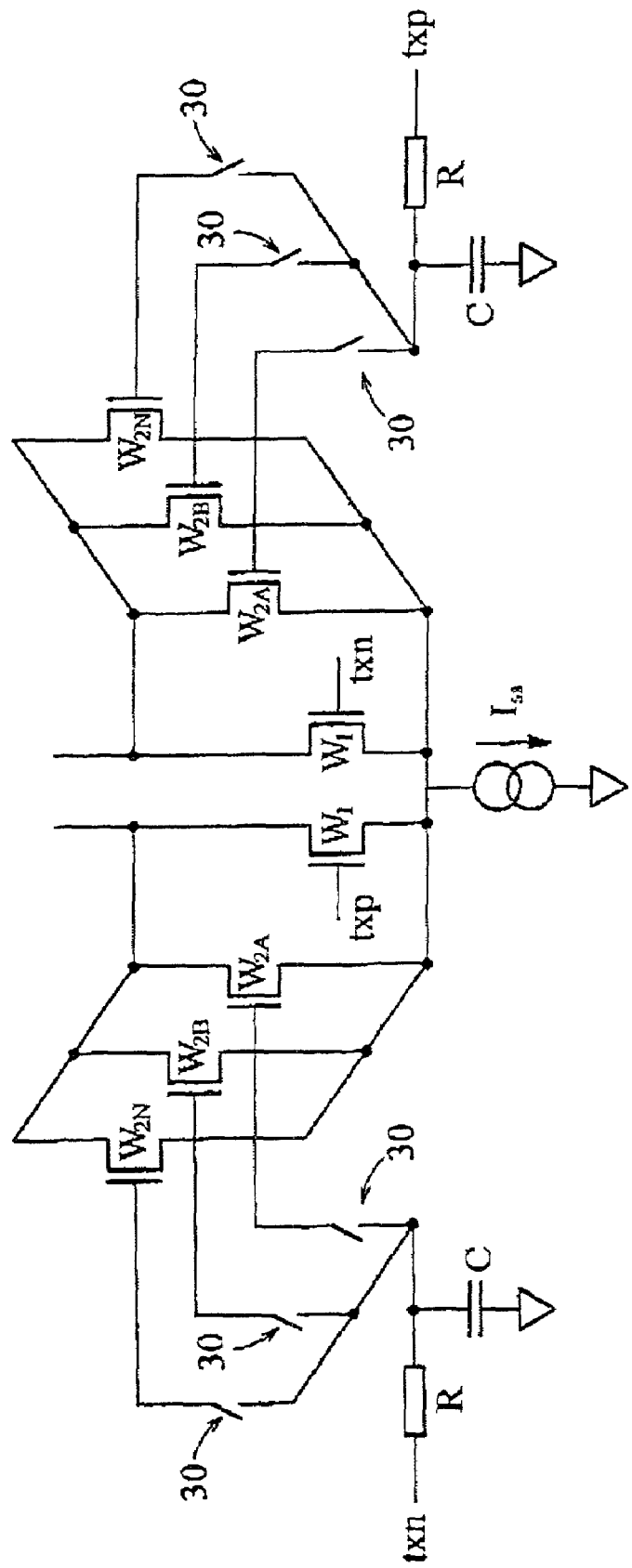
FIG. 7 shows a second driver which can be calibrated using a method according to an embodiment of the present invention.

FIG. 7 shows a second driver which is disclosed in our UK patent application 0005976.6. In this driver, tuning may be achieved without replacement of components. The circuit of FIG. 7 may be thought of as a multiple input differential pair. Each of the transistors 15,17 of FIG. 5 is replaced with a set of N (N≧2) transistors (in FIG. 7 N=3). The switches 30 can select any combination of the transistors (corresponding sets of transistors should be selected for each of the signals txp and btn). To use the terminology of FIG. 5, the more transistors that are selected the larger the effective total width of $W_2$ and the lower $\omega_2$ becomes. The N transistors for each of txp and txn can be implemented using a binary weighting so that $2^N$ combinations of settings of $W_2$ are possible.

The advantages of this approach to pre-emphasis are:
1) The use of passive components is reduced to a minimum.
2) Matching of pre-emphasis to interconnect is determined by transistor dimensions which are accurately manufactured and modelled.
3) It is possible to get gain out of the driver so that the worst case pulse has larger amplitude than would otherwise be possible with a conventional passive pre-emphasis filter.
4) This approach is amenable to low voltage operation due to the low number of devices in series.

In speed applications the low pass filter function may be implemented with capacitors since these are sufficient to load the pre-driver to roll off above the frequencies of interest.

Figure 8:
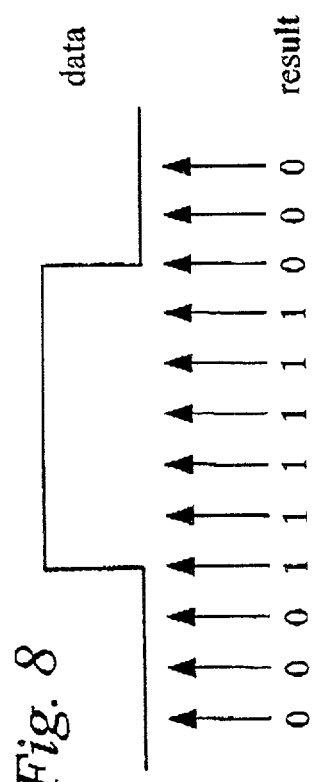
FIG. 8 illustrates a calibration method which is an embodiment of the invention.

FIG. 8 illustrates a method according to the invention for calibrating the pre-emphasis of a driver. When programmable pre-emphasis is applied to an interconnect of unknown frequency response, or it is desired to fine tune the pre-emphasis to compensate for process variation, a calibration cycle is performed. This adjusts the settings of the filter until its response best cancels that of the interconnect.

In this method the driver is controlled to transmit along the transmission lines a signal which is a worst case signal, of the kind described above with reference to FIG. 2. The transceivers in which we apply these pre-emphasis techniques have a sampler for the signal received along the transmission cable based on a receiver clock, and mixers which adjust the phase of the receiver clock in pre-determined phase steps. The mixers move the sample point across the data pulse as shown in FIG. 8. Therefore the result is a logic low, then high for six steps, and finally a low again. Pre-emphasis is increased until it takes a known number of phase steps to move the sample point across the data pulse (i.e. the pulse width measurement is correct).

Figure 9:
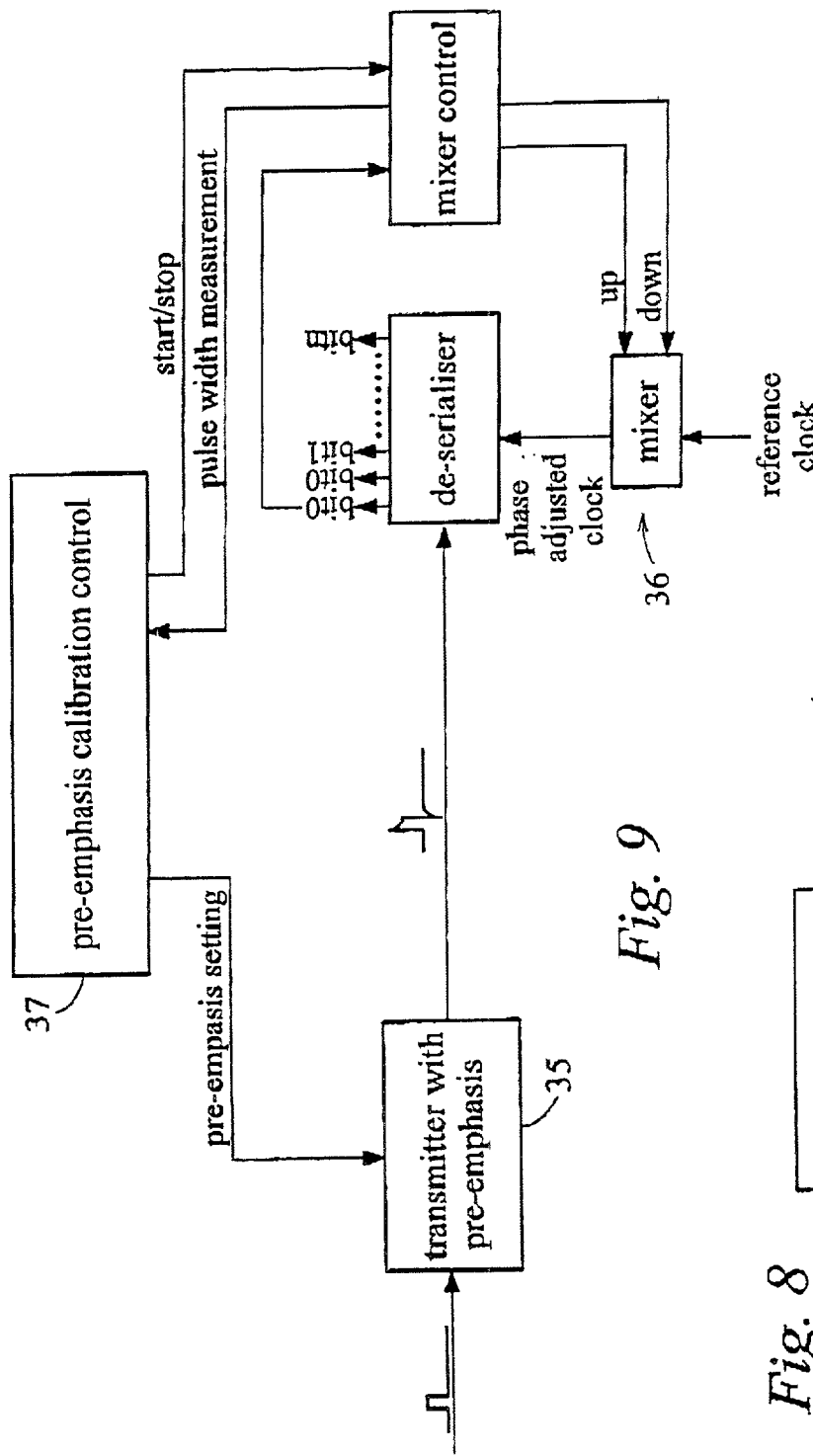
FIG. 9 illustrates a data transmission system according to the invention.

A system according to the invention which can perform this method automatically (e.g. when instructed to do so) is shown in FIG. 9. It includes a transmitter 35, which includes a driver with variable pre-emphasis. The system further includes a pulse generator (not shown) for transmitting pulses of known duration to the transmitter 35. It further includes a receiver indicated generally by reference numeral 36, including a mixer which receives a reference clock signal, a de-serialiser which produces a parallel output according to the phase of the mixer, and a mixer control for increasing or decreasing the phase of the mixer. The mixer control receives the output of the de-serialiser, and uses it to control the mixer to accurately measure the duration of received pulses as described below. The system further includes a pre-emphasis calibration control unit 37 for controlling the pre-emphasis of the driver 35 based on the measured pulse duration.

The embodiment of the method according to the invention for setting the pre-emphasis operates is as follows:

Step 1: The transmitter 35 is controlled by the unit 37 to have its pre-emphasis at minimum. It receives and re-transmits the worse case pattern (e.g. 13 0s and a 1) as a serial data stream. The unit 37 uses a line ("start/stop") to issue a command to the mixer control to measure the duration of the signal received by the receiver 36.

Step 2: The mixer control controls the phase of the mixer until the 1 is located in a pre-determined location at the parallel data output of the deserialiser (e.g. bit 0). If the 1 cannot be located then the pre-emphasis at the transmitter 35 is increased until the 1 is located.

Step 3: The mixer control decrements the phase of the mixer until the 1 is no longer present in the located bit position using the mixer. This positions the sample point at the start of the bit because it is possible to begin with the 1 initially located in the correct location in step 2.

Step 4: The phase is now incremented so that the sample point is swept across the 1 until it is no longer present in the bit location and the number of increments counted.

Step 5: If the number of increments is less than the value for the correct pulse width then calibration control unit 37 increments the pre-emphasis at the transmitter 35 and the procedure from step 2 is repeated.

This procedure does not require any data alignment to be performed which is advantageous since the frequency response of the interconnect could prevent alignment being maintained. Note that the approach takes into account process variation of the filter components and transistor gains since they are included in the measurement procedure. Also, no extra high speed hardware is required and only a simple control function needs to be implemented.

Although the invention has been described above in relation to particular embodiments, many variations are possible within the scope of the invention as will be clear to a skilled person.

What is claimed is:

1. A method of calibrating a system which includes a device for differentially amplifying low frequency components and high frequency components in a received signal, and in which the amplified signal is transmitted from a first end of a transmission line to a second end of the transmission line, the method including:

repeatedly generating pulses of known duration;

using the device to amplify low frequency components and high frequency components in the generated pulses to different degrees to form a modified pulse, and transmit the modified pulses along the line from the first end;

measuring the duration of the pulses received at the second end; and increasing the degree to which high frequency components are amplified relative to low frequency components until the measured duration of the received pulses is equal to the known duration of the generated pulses to within a predetermined tolerance.

2. A method according to claim 1, in which the duration of the received pulses is measured using a unit which samples the signal received at the second end of the line based on a clock signal having a tunable phase, the method including varying the phase of the clock signal until a given sample output from the unit which samples coincides with an end of each received pulse, and measuring the duration of received pulses by taking multiple samples across the received pulses.

3. A method according to claim 1 in which the device is arranged in normal use to transmit pulses having respective durations which are integer numbers of clock cycles, the pulses of known duration each being a single clock cycle in length.

4. A method according to claim 1 in which the system has two transmission lines, the device transmitting equal and opposite signals into a first end of each transmission line and the duration of the received pulse being measured using signals received at the second end of the transmission lines.

5. A data transmission system which includes:

a pre-emphasis unit for receiving a signal, differentially amplifying low frequency components and high frequency components in the received signal and transmitting the amplified signal into a first end of a transmission line, a pulse generator for repeatedly generating pulses of known duration and supplying them to the pre-emphasis unit;

a receiver located at a second end of the transmission line for receiving the pulses and measuring the duration of the received pulses received; and a control unit for controlling the pre-emphasis unit to increase the degree to which high frequency components are amplified relative to low frequency components until the measured duration of the received pulses is equal to the known duration of the generated pulses to within a predetermined tolerance.

6. A system according to claim 5 in which the receiver comprises a mixer unit for modifying the phase of a clock signal and sampler unit arranged to receive the signal at the second end of the line and sample the received signal based on the modified clock signal, and a mixer control unit for controlling the mixer unit to vary the phase of the clock signal until a given sample from the sampler coincides with an end of the received pulse and measure the duration of the received pulses by taking samples across the received pulse.

7. A system according to claim 5 arranged in normal use the transmit pulses having respective durations which are an integer number of clock cycles, the pulse generator generating the pulses of known duration to be a single clock cycle in length.

8. A system according to claim 5 in which there are two transmission lines, the pre-emphasis unit being arranged to transmit equal and opposite signals into a first end of each transmission line and the receiver being arranged to measure the duration of the received pulse using signals received at the second end of the transmission lines.

* * * * *